(12) United States Patent
Hashimoto et al.

(10) Patent No.: US 9,236,563 B2
(45) Date of Patent: Jan. 12, 2016

(54) MAGNETIC MEMORY DEVICE AND METHOD OF MANUFACTURING THE MAGNETIC MEMORY DEVICE

(71) Applicants: Yutaka Hashimoto, Seoul (KR); Tadashi Kai, Seoul (KR); Masahiko Nakayama, Seoul (KR); Hiroaki Yoda, Seoul (KR); Toshihiko Nagase, Seoul (KR); Masatoshi Yoshikawa, Seoul (KR); Yasuyuki Sonoda, Seoul (KR)

(72) Inventors: Yutaka Hashimoto, Seoul (KR); Tadashi Kai, Seoul (KR); Masahiko Nakayama, Seoul (KR); Hiroaki Yoda, Seoul (KR); Toshihiko Nagase, Seoul (KR); Masatoshi Yoshikawa, Seoul (KR); Yasuyuki Sonoda, Seoul (KR)

( * ) Notice: Subject to any disclaimer, the term of this patent is extended or adjusted under 35 U.S.C. 154(b) by 0 days.

(21) Appl. No.: 14/200,894

(22) Filed: Mar. 7, 2014

(65) Prior Publication Data

US 2015/0069552 A1    Mar. 12, 2015

Related U.S. Application Data

(60) Provisional application No. 61/875,569, filed on Sep. 9, 2013.

(51) Int. Cl.
*G11C 11/16* (2006.01)
*H01L 43/12* (2006.01)
*H01L 43/08* (2006.01)

(52) U.S. Cl.
CPC ............ *H01L 43/12* (2013.01); *G11C 11/161* (2013.01); *H01L 43/08* (2013.01)

(58) Field of Classification Search
CPC ..................................................... G11C 11/161
USPC ............................................................ 365/158
See application file for complete search history.

(56) References Cited

U.S. PATENT DOCUMENTS

| 8,363,459 B2 * | 1/2013 | Zhu et al. ................ 365/158 |
| 2009/0227045 A1 | 9/2009 | Li |
| 2010/0193888 A1 | 8/2010 | Gu et al. |
| 2011/0044096 A1 | 2/2011 | Li |
| 2011/0233696 A1 | 9/2011 | Li |
| 2013/0119497 A1 | 5/2013 | Li |
| 2014/0011298 A1 | 1/2014 | Li |

FOREIGN PATENT DOCUMENTS

JP    2008-226919 A    9/2008

* cited by examiner

*Primary Examiner* — Mark Prenty
(74) *Attorney, Agent, or Firm* — Holtz, Holtz, Goodman & Chick PC

(57) ABSTRACT

According to one embodiment, a magnetic memory device includes a magnetoresistance effect element having a structure in which a first magnetic layer, a nonmagnetic layer, a second magnetic layer, and a third magnetic layer are stacked, wherein the third magnetic layer comprises a first region and a plurality of second regions, and each of the second regions is surrounded by the first region, has conductivity, and has a greater magnetic property than the first region.

13 Claims, 9 Drawing Sheets

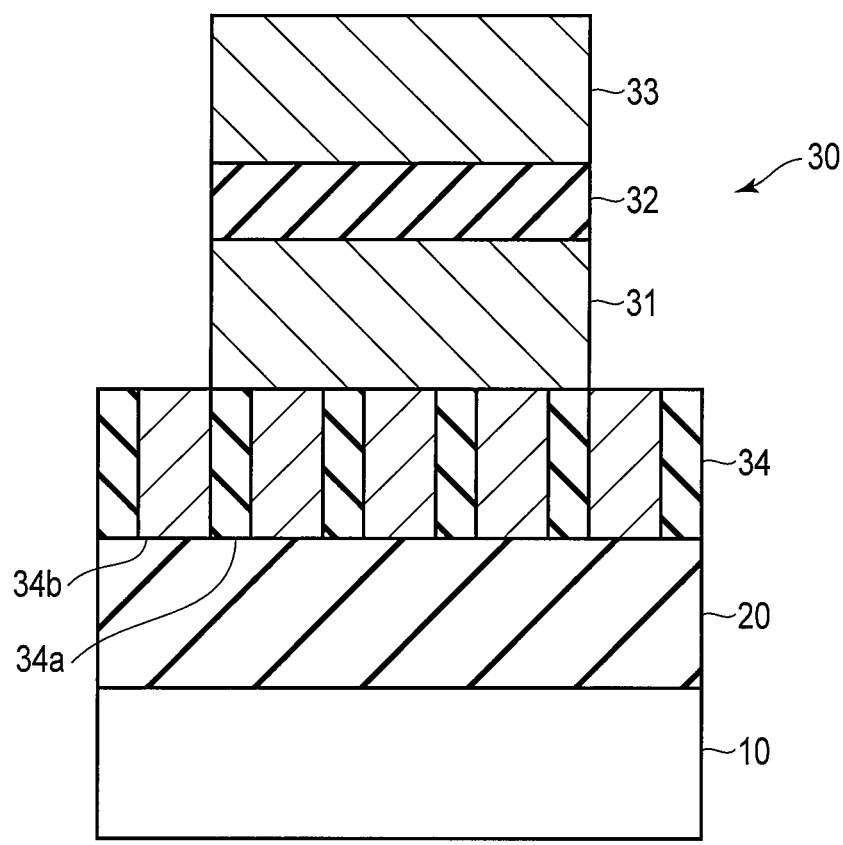
F I G. 1

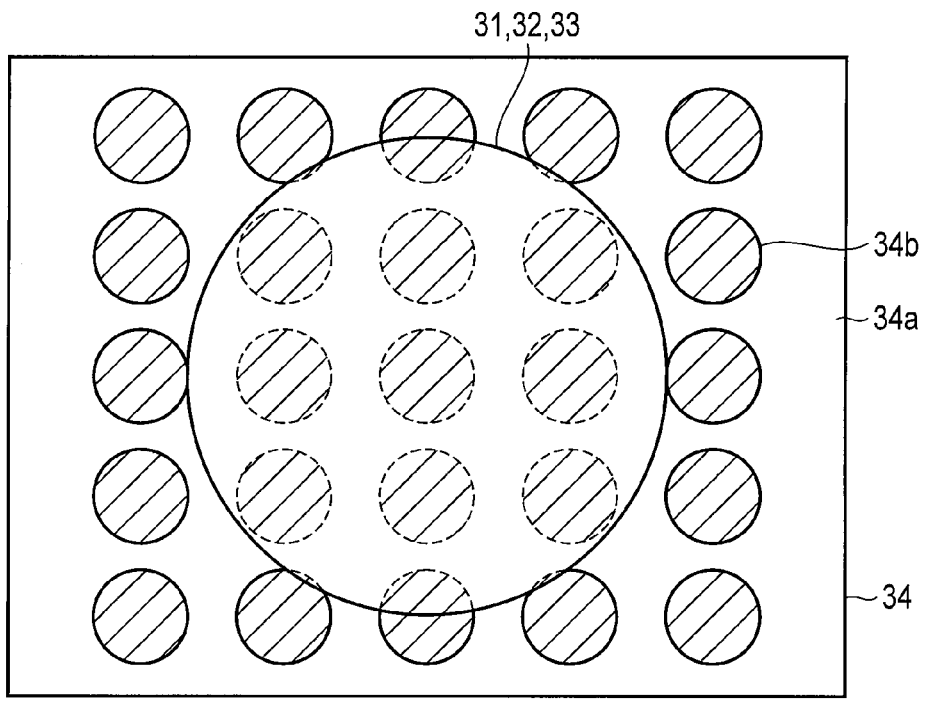
F I G. 2
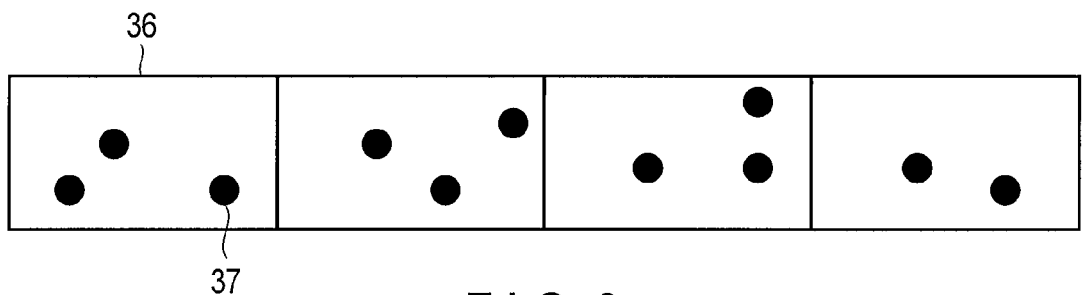
F I G. 3
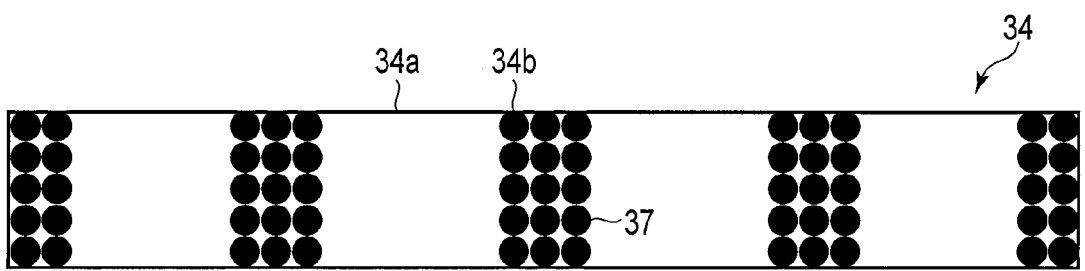
F I G. 4

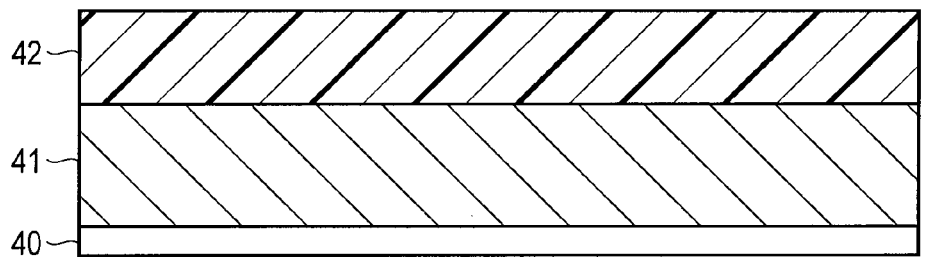
F I G. 5
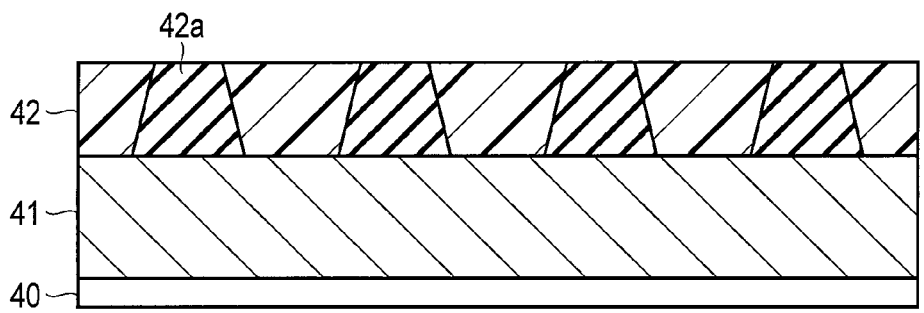
F I G. 6
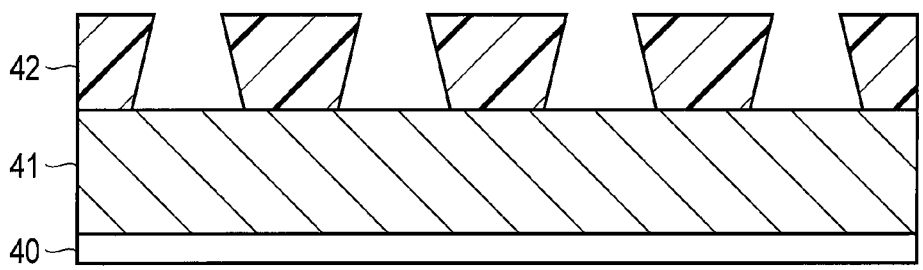
F I G. 7
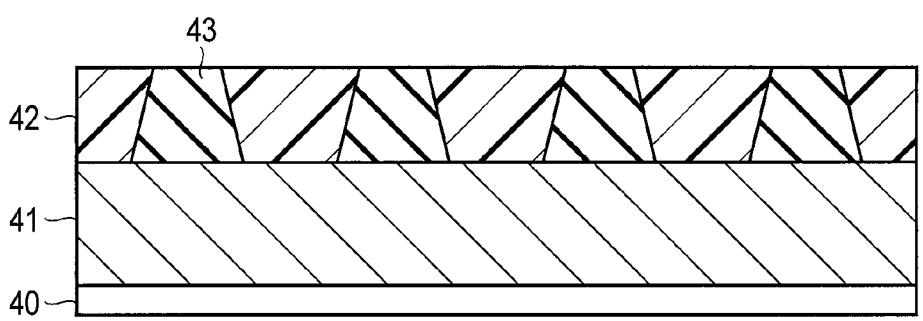
F I G. 8

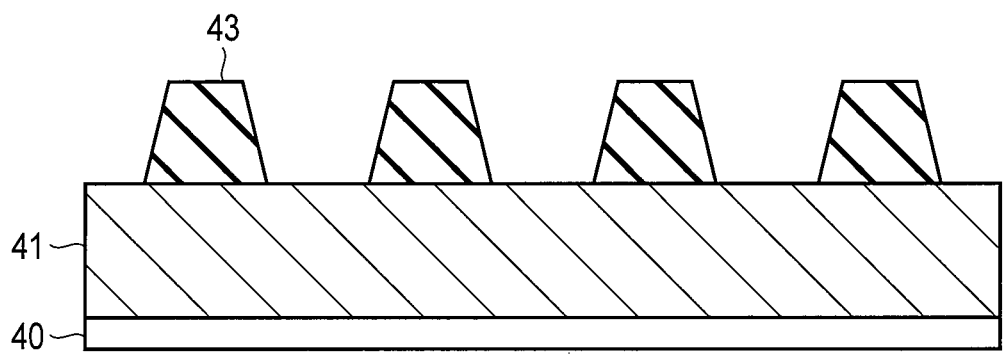
F I G. 9
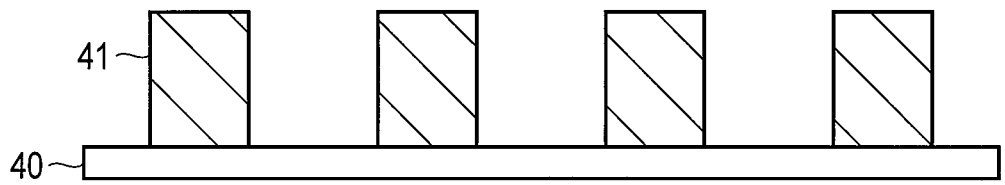
F I G. 10
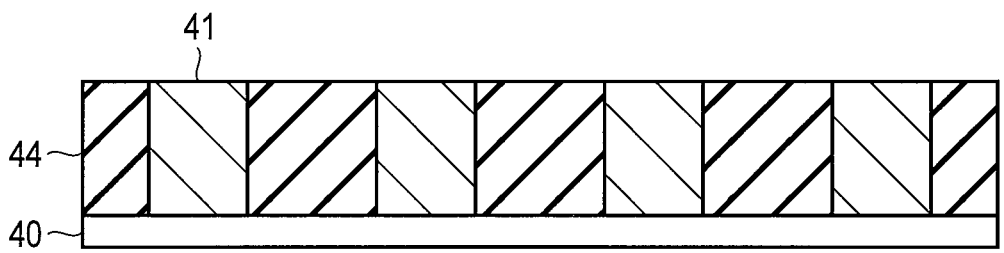
F I G. 11

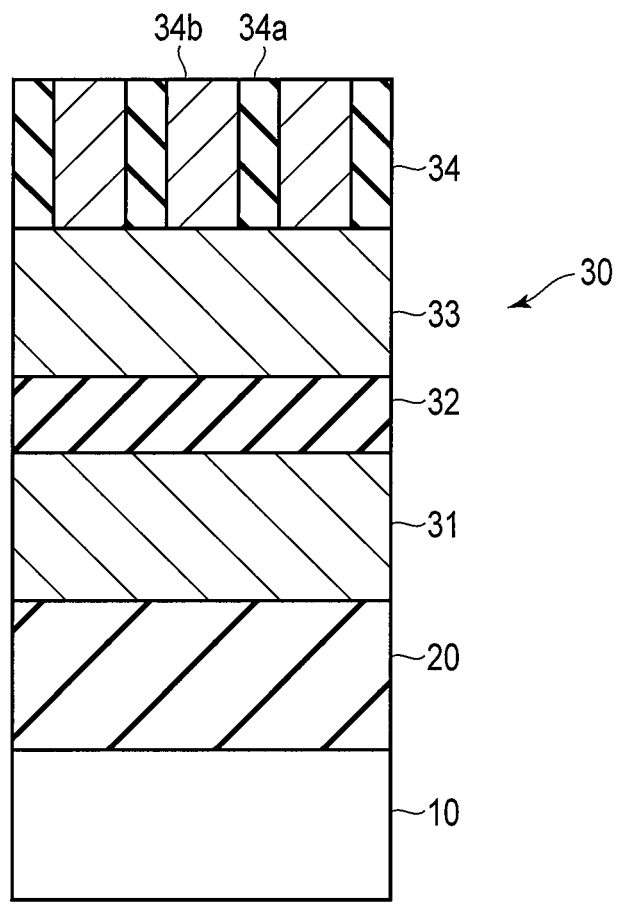
F I G. 12

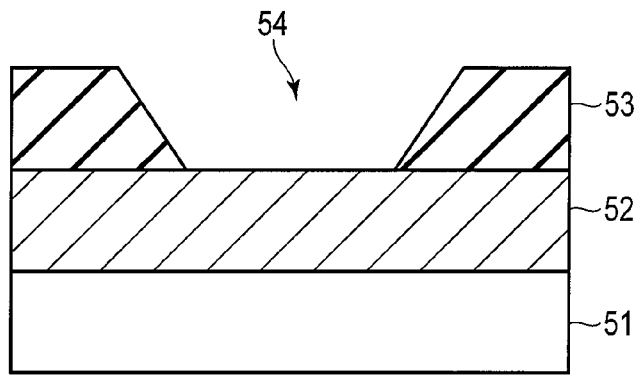
F I G. 1 3
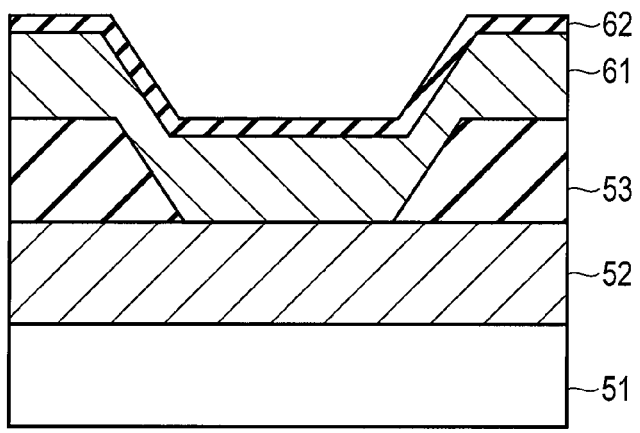
F I G. 1 4
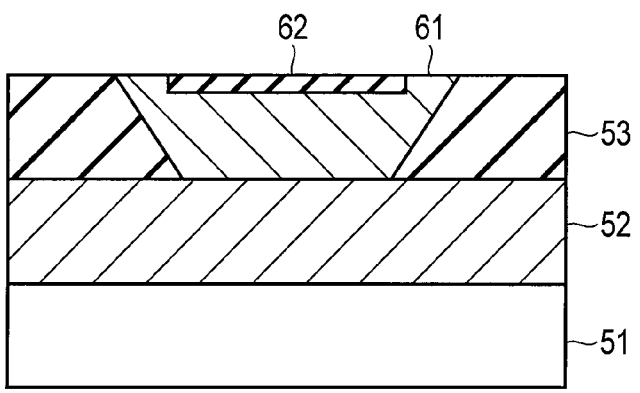
F I G. 1 5

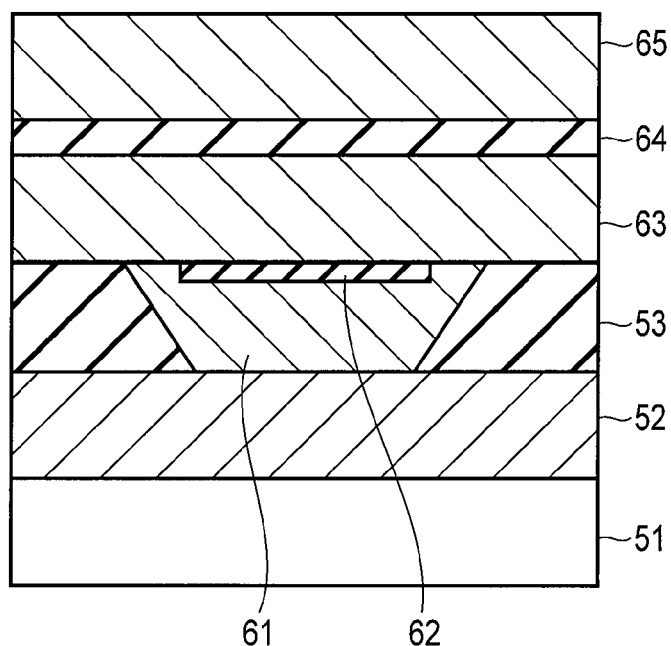
F I G. 16
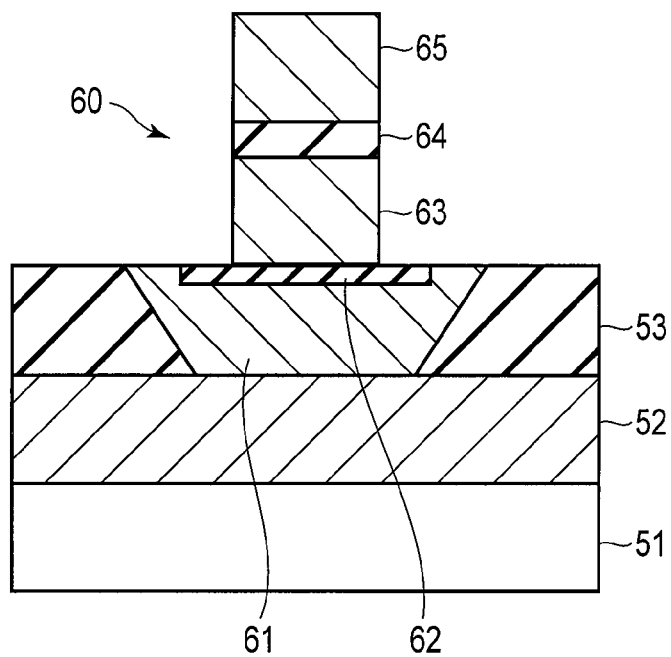
F I G. 17

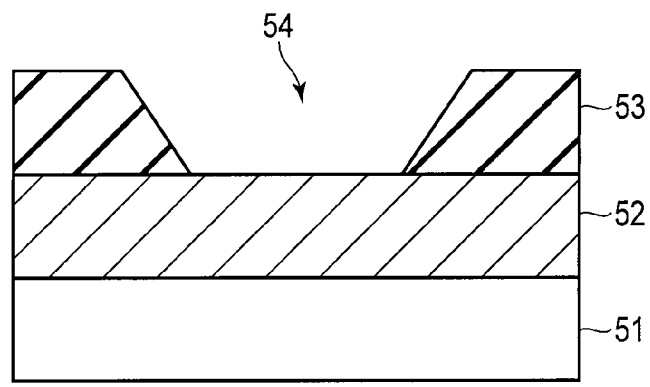
F I G. 1 8
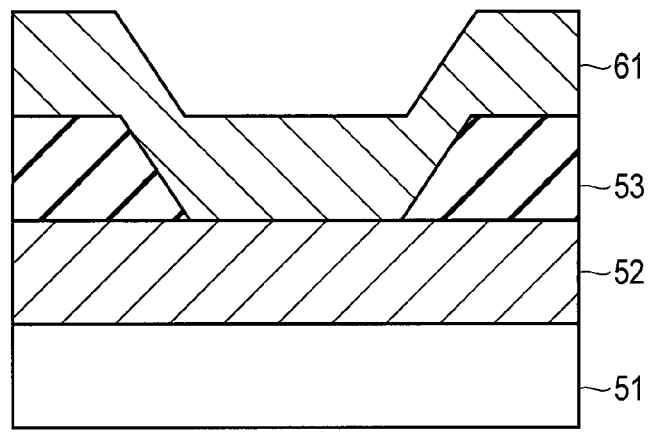
F I G. 1 9
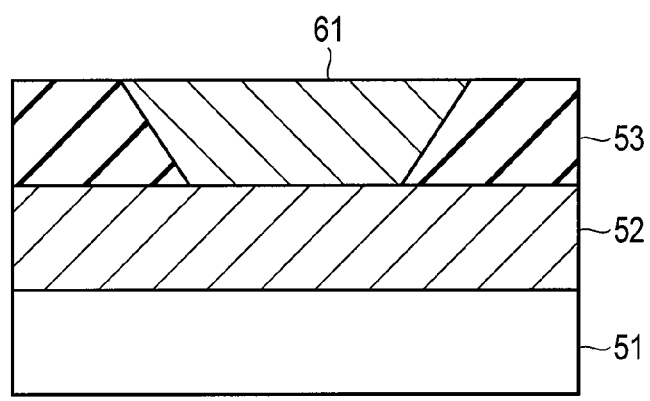
F I G. 2 0

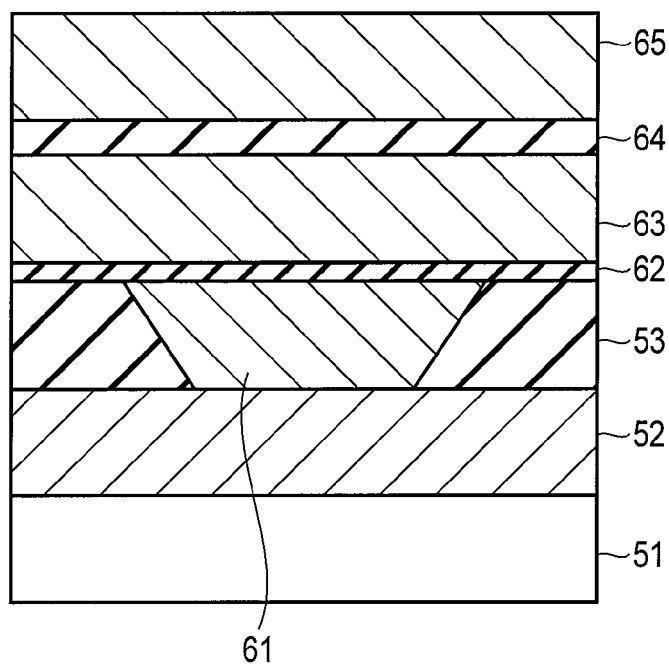
F I G. 2 1
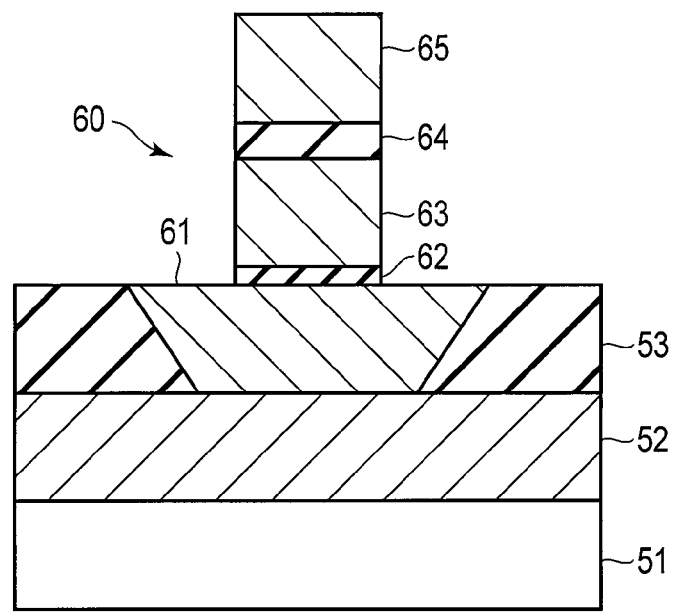
F I G. 2 2

MAGNETIC MEMORY DEVICE AND METHOD OF MANUFACTURING THE MAGNETIC MEMORY DEVICE

CROSS-REFERENCE TO RELATED APPLICATIONS

This application claims the benefit of U.S. Provisional Application No. 61/875,569, filed Sep. 9, 2013, the entire contents of which are incorporated herein by reference.

FIELD

Embodiments described herein relate generally to a magnetic memory device and a method of manufacturing the same.

BACKGROUND

In a magnetic memory device which uses a magnetoresistance effect element (a magnetic tunnel junction [MTJ] element) exhibiting perpendicular magnetization, in order to cancel a magnetic field applied from a reference layer on a storage layer, a shift cancelling layer is provided.

However, even though the shift cancelling layer is provided, it is not easy to effectively cancel the magnetic field applied from the reference layer on the storage layer.

In order to cancel the magnetic field applied from the reference layer on the storage layer, it is effective to thicken the shift cancelling layer. However, if the MTJ element is miniaturized as a result of high integration of the magnetic memory device, processing (patterning) of a thick shift cancelling layer becomes extremely difficult. If the shift cancelling layer is made thinner, it becomes difficult to effectively cancel the magnetic field applied from the reference layer on the storage layer.

Therefore, a high-performance magnetic memory device capable of effectively cancelling the magnetic field applied from the reference layer on the storage layer is desired.

BRIEF DESCRIPTION OF THE DRAWINGS

FIG. 1 is a cross-sectional view which schematically shows a structure of a magnetic memory device according to a first embodiment;

FIG. 2 is a plan view which schematically shows the structure of the magnetic memory device according to the first embodiment;

FIG. 3 is an illustration which schematically shows a part of a method of manufacturing the magnetic memory device according to the first embodiment;

FIG. 4 is an illustration which schematically shows a part of the method of manufacturing the magnetic memory device according to the first embodiment;

FIG. 5 is a cross-sectional view which schematically shows a part of a method of manufacturing a magnetic memory device according to a second embodiment;

FIG. 6 is a cross-sectional view which schematically shows a part of the method of manufacturing the magnetic memory device according to the second embodiment;

FIG. 7 is a cross-sectional view which schematically shows a part of the method of manufacturing the magnetic memory device according to the second embodiment;

FIG. 8 is a cross-sectional view which schematically shows a part of the method of manufacturing the magnetic memory device according to the second embodiment;

FIG. 9 is a cross-sectional view which schematically shows a part of the method of manufacturing the magnetic memory device according to the second embodiment;

FIG. 10 is a cross-sectional view which schematically shows a part of the method of manufacturing the magnetic memory device according to the second embodiment;

FIG. 11 is a cross-sectional view which schematically shows a part of the method of manufacturing the magnetic memory device according to the second embodiment;

FIG. 12 is a cross-sectional view which schematically shows a structure of a magnetic memory device according to a third embodiment;

FIG. 13 is a cross-sectional view which schematically shows a part of a method of manufacturing a magnetic memory device according to a fourth embodiment;

FIG. 14 is a cross-sectional view which schematically shows a part of the method of manufacturing the magnetic memory device according to the fourth embodiment;

FIG. 15 is a cross-sectional view which schematically shows a part of the method of manufacturing the magnetic memory device according to the fourth embodiment;

FIG. 16 is a cross-sectional view which schematically shows a part of the method of manufacturing the magnetic memory device according to the fourth embodiment;

FIG. 17 is a cross-sectional view which schematically shows a part of the method of manufacturing the magnetic memory device according to the fourth embodiment;

FIG. 18 is a cross-sectional view which schematically shows a part of a method of manufacturing a magnetic memory device according to a modified example of the fourth embodiment;

FIG. 19 is a cross-sectional view which schematically shows a part of the method of manufacturing the magnetic memory device according to the modified example of the fourth embodiment;

FIG. 20 is a cross-sectional view which schematically shows a part of the method of manufacturing the magnetic memory device according to the modified example of the fourth embodiment;

FIG. 21 is a cross-sectional view which schematically shows a part of the method of manufacturing the magnetic memory device according to the modified example of the fourth embodiment; and FIG. 22 is a cross-sectional view which schematically shows a part of the method of manufacturing the magnetic memory device according to the modified example of the fourth embodiment.

DETAILED DESCRIPTION

In general, according to one embodiment, a magnetic memory device includes a magnetoresistance effect element having a structure in which a first magnetic layer, a nonmagnetic layer, a second magnetic layer, and a third magnetic layer are stacked, wherein the third magnetic layer comprises a first region and a plurality of second regions, and each of the second regions is surrounded by the first region, has conductivity, and has a greater magnetic property than the first region.

Embodiments will be hereinafter described with reference to the accompanying drawings.

Embodiment 1

FIG. 1 is a cross-sectional view which schematically shows a structure of the magnetic memory device according to a first embodiment. FIG. 2 is a plan view which schematically shows the structure of the magnetic memory device according to the first embodiment.

As shown in FIG. 1, the magnetic memory device comprises a semiconductor substrate 10, an underlying region 20 including an insulating film and an interconnect, etc., and a magnetoresistance effect element (MTJ element) 30 formed on the underlying region 20.

The magnetoresistance effect element 30 is a spin-transfer-torque (STT) magnetic storage element, and includes a storage layer 31, a tunnel barrier layer 32, a reference layer 33, and a shift cancelling layer 34. More specifically, the magnetoresistance effect element 30 has a structure in which the shift cancelling layer 34, the storage layer 31, the tunnel barrier layer 32, and the reference layer 33 are stacked in this order.

The storage layer 31 and the reference layer 33 are formed of a magnetic material. The storage layer 31 has a variable magnetization direction and the reference layer 33 has a fixed magnetization direction. A current which runs through the magnetoresistance effect element 30 changes in accordance with the magnetization direction of the storage layer 31. Therefore, information is stored based on the magnetization direction of the storage layer 31 (0 or 1 is stored).

The shift cancelling layer 34 is provided in order to cancel a magnetic field applied from the reference layer on the storage layer. As shown in FIGS. 1 and 2, the shift cancelling layer 34 comprises a first region 34a and a plurality of second regions 34b. Each of the second regions 34b is surrounded by the first region 34a, has conductivity, and has a greater magnetic property than the first region 34a.

The first region 34a is an insulating region formed of an insulating material. The second regions 34b are magnetic and conductive regions formed of a material having magnetic and conductive properties. More specifically, the second regions 34b are formed by using a metal material. In addition, each of the second regions has a columnar shape, and penetrates through the shift cancelling layer 34.

As shown in FIGS. 1 and 2, an area of the shift cancelling layer 34 is larger than an area of a pattern of the storage layer 31, the tunnel barrier layer 32, and the reference layer 33. That is, seeing the layers from a direction in which the shift cancelling layer 34, the storage layer 31, the tunnel barrier layer 32, and the reference layer 33 are stacked, a region of the pattern of the storage layer 31, the tunnel barrier layer 32, and the reference layer 33 is included in a region of the shift cancelling layer 34.

In addition, the shift cancelling layer 34 is not patterned. Therefore, in a region between adjacent magnetoresistance effect elements 30, the shift cancelling layer 34 is formed in continuity.

Generally, as compared to a case where a single contiguous magnetic region is provided, when several discontiguous magnetic regions are provided, a magnetic field (magnetic force) exerted on the other region can be made greater. In the present embodiment, the shift cancelling layer 34 includes a plurality of magnetic regions (the second regions 34b) which are separated from each other. Therefore, as compared to a case where the entire shift cancelling layer is formed by a single contiguous magnetic region, it is possible to increase the magnetic field (magnetic force) exerted on the storage layer 31 by the shift cancelling layer 34. Thus, according to the present embodiment, a magnetic field applied from the reference layer 33 on the storage layer 31 can be effectively cancelled by the shift cancelling layer 34.

Further, in the present embodiment, each of the second regions 34b (magnetic and conductive regions) is surrounded by the first region 34a (insulating region), and the second regions 34b are separated from each other. Accordingly, electrical insulation properties in a horizontal direction of the shift cancelling layer 34 are secured. That is, in a region between adjacent magnetoresistance effect elements 30, even though the shift cancelling layer 34 is formed in continuity, the electrical insulation properties in the horizontal direction are secured. Therefore, there is no need to pattern the shift cancelling layer 34. That is, there is no need to process the shift cancelling layer 34. Therefore, the shift cancelling layer 34 can be formed to be thick. Accordingly, also in the viewpoint as described above, according to the present embodiment, the magnetic field applied from the reference layer 33 on the storage layer 31 can be effectively cancelled by the shift cancelling layer 34.

In addition, in the present embodiment, since the second regions 34b penetrate through the shift cancelling layer 34, electrical conductivity in a vertical direction is secured. Accordingly, operation of the magnetoresistance effect element 30 (writing operation, reading operation) can be performed normally.

In view of the foregoing, according to the present embodiment, it is possible to obtain a magnetic memory device including the magnetoresistance effect element 30 that is highly efficient, and by which the magnetic field applied from the reference layer 33 on the storage layer 31 can be effectively cancelled.

It should be noted that the shift cancelling layer 34 may be patterned so that the shift cancelling layer 34 is separated from another shift cancelling layer 34 at a region between adjacent magnetoresistance effect elements 30. In this case, processing of the magnetoresistance effect element 30 may be more difficult than in the case of the above-mentioned embodiment. However, since the magnetic regions (second regions 34b) are separated, as described above, a magnetic field (magnetic force) exerted on the storage layer 31 by the shift cancelling layer 34 can be increased. Accordingly, the shift cancelling layer 34 can be made thin. Therefore, it is possible to reduce the difficulty of processing the magnetoresistance effect element 30. Further, when the shift cancelling layer is separated into a plurality of regions, a magnetoresistance effect element may be arranged per separated region or a plurality of magnetoresistance effect elements may be arranged per separated region.

In addition, when the shift cancelling layer 34 is to be patterned, the shift cancelling layer 34 is physically separated from another shift cancelling layer 34 at a region between adjacent magnetoresistance effect elements 30. Therefore, the first region 34a does not necessarily have to be an insulating region. It is sufficient if the second region 34b has a greater (higher) magnetic property than the first region 34a.

Moreover, in the above embodiment, a spacer layer may be arranged between the storage layer 31 and the shift cancelling layer 34.

FIGS. 3 and 4 are illustrations which schematically show a part of a method of manufacturing the magnetic memory device according to the present embodiment. To be more precise, FIGS. 3 and 4 are illustrations which schematically show a method of forming the shift cancelling layer 34 of the magnetoresistance effect element 30 shown in FIGS. 1 and 2.

Firstly, as shown in FIG. 3, a preliminary layer 36 containing a plurality of magnetic particles (magnetic grains) 37 is formed. More specifically, the preliminary layer 36 containing the plurality of magnetic particles 37 in an insulating material is formed on the underlying region 20 shown in FIG. 1.

Secondly, as shown in FIG. 4, the preliminary layer 36 is annealed, and the first region 34a and the plurality of second regions 34b are formed. By suitably adjusting parameters, such as a material (type), a particle diameter and density of the magnetic particles 37, a kind of the insulating material and a thickness thereof, and annealing temperature and annealing time, it is possible to automatically gather the magnetic particles 37 at a plurality of places by annealing treatment. As a result, as shown in FIG. 4, each of the second regions 34b is structured by the plurality of magnetic particles 37 that are gathered together.

As regards the method mentioned above, the reference "C. Petit, A. Taleb, M. P. Pileni, Adv. Mater. 1998, 10, 259.", for example, can be referred to.

According to the manufacturing method of the present embodiment described above, the plurality of second regions 34b can be formed automatically. Therefore, the plurality of second regions 34b can be formed without using lithography technology. Consequently, the plurality of second regions 34b that are minute can by formed in the shift cancelling layer 34.

Embodiment 2

Next, a second embodiment will be described. Note that a basic structure is the same as that of the first embodiment shown in FIGS. 1 and 2. Therefore, explanation of the matters already described in the first embodiment will be omitted.

The present embodiment relates to another method of forming a shift cancelling layer 34 in the magnetic memory device shown in FIGS. 1 and 2. A manufacturing method will now be described with reference to FIGS. 5 to 11.

Firstly, as shown in FIG. 5, a magnetic film 41 having conductivity is formed on an underlying region 40. Subsequently, a polymer film 42 is formed on the magnetic film 41.

Next, as shown in FIG. 6, by using self-organization technique, a self-organization portion 42a is formed on the polymer film 42.

Next, as shown in FIG. 7, by removing the self-organization portion 42a, a plurality of holes are formed in the polymer film 42.

Next, as shown in FIG. 8, the holes formed in the step of FIG. 7 are filled with a hard mask film 43.

Next, as shown in FIG. 9, the polymer film 42 is removed and the hard mask film 43 is maintained.

Next, as shown in FIG. 10, the magnetic film 41 is etched by using the hard mask film 43 as a mask. Then, the hard mask film 43 is removed. In this way, a plurality of columnar portions formed by the magnetic film 41 are formed.

Next, as shown in FIG. 11, an insulating film 44 is formed on the entire surface. The insulating film 44 is planarized by chemical mechanical polishing (CMP). In this way, a shift cancelling layer (corresponding to the shift cancelling layer 34 of FIGS. 1 and 2) including an insulating region formed by the insulating film 44 (corresponding to the first region 34a of FIGS. 1 and 2), and a plurality of magnetic regions formed by the magnetic film 41 (corresponding to the second regions 34b of FIGS. 1 and 2) is formed. That is, in the present step, by filling an area surrounding a pattern of the magnetic regions (second regions) 41 with an insulating material, the insulating region (first region) 44 is formed.

By using the shift cancelling layer formed by the above-described method, it is possible to manufacture the magnetic memory device as shown in FIGS. 1 and 2 of the first embodiment.

Embodiment 3

Next, a third embodiment will be described. Note that a basic structure is similar to that of the first embodiment shown in FIGS. 1 and 2. Therefore, explanation of the matters already described in the first embodiment will be omitted.

FIG. 12 is a cross-sectional view which schematically shows a structure of a magnetic memory device according to the present embodiment. Note that structural elements corresponding to those shown in FIG. 1 of the first embodiment will be denoted by the same reference numerals as in the first embodiment, and their detailed explanations will be omitted.

As shown in FIG. 12, the magnetic memory device comprises a semiconductor substrate 10, an underlying region 20 including an insulating film and an interconnect, etc., and a magnetoresistance effect element (MTJ element) 30 formed on the underlying region 20.

The magnetoresistance effect element 30 is a spin-transfer-torque (STT) magnetic storage element, and includes a storage layer 31, a tunnel barrier layer 32, a reference layer 33, and a shift cancelling layer 34. More specifically, the magnetoresistance effect element 30 has a structure in which the storage layer 31, the tunnel barrier layer 32, the reference layer 33, and the shift cancelling layer 34 are stacked in this order.

As shown in FIG. 12, in the present embodiment, the shift cancelling layer 34 is provided as a top layer part of the magnetoresistance effect element 30. A basic structure of the shift cancelling layer 34 is the same as that of the first embodiment. That is, the shift cancelling layer 34 comprises a first region 34a and a plurality of second regions 34b. Explanations given in the first embodiment apply to the first region 34a and the second regions 34b of the present embodiment.

A basic planar structure of the shift cancelling layer 34 is the same as the structure shown in FIG. 2 of the first embodiment. However, since the shift cancelling layer 34 is formed as the top layer part of the magnetoresistance effect element 30, the shift cancelling layer 34 is patterned. Therefore, a planar form of the shift cancelling layer 34 is substantially the same as that of the storage layer 31, the tunnel barrier layer 32, and the reference layer 33.

The method described in the first embodiment or the second embodiment can be applied to a method of forming the shift cancelling layer 34.

Also in the present embodiment, as in the first embodiment, the shift cancelling layer 34 includes a plurality of magnetic regions (second regions 34b) that are separated from each other. Accordingly, as compared to a case where the entire shift cancelling layer is formed by a contiguous magnetic region, it is possible to increase a magnetic field (magnetic force) exerted on the storage layer 31 by the shift cancelling layer 34. Therefore, also in the present embodiment, the magnetic field applied from the reference layer 33 on the storage layer 31 can be cancelled effectively.

Embodiment 4

FIGS. 13 to 17 are cross-sectionals views which schematically show a method of manufacturing a magnetic memory device according to a fourth embodiment.

Firstly, as shown in FIG. 13, a peripheral region 53 having a hole 54 is formed on an underlying region 52 over a semiconductor substrate 51. The underlying region 52 is formed of tantalum (Ta). The peripheral region 53 is formed by an insulating region of silicon nitride (SiN) film, or the like.

Next, as shown in FIG. 14, a shift cancelling layer 61 is formed on the underlying region 52 and the peripheral region 53. Further, a spacer layer 62 is formed on the shift cancelling layer 61.

Next, as shown in FIG. 15, the shift cancelling layer 61 and the spacer layer 62 are planarized by CMP. In this way, a structure in which the shift cancelling layer 61 and the spacer layer 62 are formed in the hole 54 can be obtained.

Next, as shown in FIG. 16, a storage layer 63, a tunnel barrier layer 64, and a reference layer 65 are formed on the peripheral region 53, the shift cancelling layer 61, and the spacer layer 62.

Next, as shown in FIG. 17, by ion beam etching (IBE), the storage layer 63, the tunnel barrier layer 64, and the reference layer 65 are etched. In this way, a layered structure including the storage layer 63, the tunnel barrier layer 64, and the reference layer 65 is formed on the shift cancelling layer 61 via the spacer layer 62.

By the above method, as shown in FIG. 17, a magnetoresistance effect element 60 comprising the shift cancelling layer 61, the spacer layer 62, the storage layer 63, the tunnel barrier layer 64, and the reference layer 65 is manufactured. An area of the shift cancelling layer 61 is larger than an area of a pattern of the storage layer 63, the tunnel barrier layer 64, and the reference layer 65.

In the present embodiment, the shift cancelling layer 61 is formed in the hole 54 of the peripheral region 53. That is, the shift cancelling layer 61 is formed not by etching but by the so-called damascene process. Accordingly, it is necessary to etch only the storage layer 63, the tunnel barrier layer 64, and the reference layer 65. Accordingly, it is possible to reduce a total processing thickness of the magnetoresistance effect element 60, and manufacturing of the magnetoresistance effect element 60 is facilitated. In addition, since the shift cancelling layer 61 does not need to be etched, the shift cancelling layer 61 can be formed to be thick. Accordingly, a magnetic field applied from the reference layer 65 on the storage layer 63 can be effectively cancelled by the shift cancelling layer 61, and it becomes possible to obtain a high-performance magnetic memory device.

FIGS. 18 to 22 are cross-sectional views which schematically show a method of manufacturing a magnetic memory device according to a modified example of the fourth embodiment. Since a basic structure and a basic manufacturing method are similar to those of the above-described embodiment, structural elements corresponding to the structural elements shown in FIGS. 13 to 17 will be denoted by the same reference numerals as in the embodiment of FIGS. 13 to 17, and their detailed explanations will be omitted.

Firstly, as shown in FIG. 18, as in the step of FIG. 13, a peripheral region 53 having a hole 54 is formed on an underlying region 52 over a semiconductor substrate 51.

Next, as shown in FIG. 19, a shift cancelling layer 61 is formed on the underlying region 52 and the peripheral region 53.

Next, as shown in FIG. 20, the shift cancelling layer 61 is planarized by CMP. In this way, a structure in which the shift cancelling layer 61 is formed in the hole 54 is obtained.

Next, as shown in FIG. 21, a spacer layer 62, storage layer 63, a tunnel barrier layer 64, and a reference layer 65 are formed on the peripheral region 53 and the shift cancelling layer 61.

Next, as shown in FIG. 22, by IBE, the spacer layer 62, the storage layer 63, the tunnel barrier layer 64, and the reference layer 65 are etched. In this way, a stacked structure including the spacer layer 62, the storage layer 63, the tunnel barrier layer 64, and the reference layer 65 is formed on the shift cancelling layer 61.

By the method described above, as shown in FIG. 22, a magnetoresistance effect element 60 comprising the shift cancelling layer 61, the spacer layer 62, the storage layer 63, the tunnel barrier layer 64, and the reference layer 65 is manufactured. An area of the shift cancelling layer 61 is larger than an area of a pattern of the spacer layer 62, the storage layer 63, the tunnel barrier layer 64, and the reference layer 65.

Also in the present embodiment, as in the above-described embodiment, the shift cancelling layer 61 is formed by the damascene process. Accordingly, an advantage similar to that obtained by the above-mentioned embodiment can be obtained.

It should be noted that the manufacturing method of the present embodiment can be combined with the manufacturing method shown in the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising a magnetoresistance effect element having a structure in which a first magnetic layer, a nonmagnetic layer, a second magnetic layer, and a third magnetic layer are stacked,
    wherein the third magnetic layer comprises a first region and a plurality of second regions, and each of the second regions is surrounded by the first region, has conductivity, and has a greater magnetic property than the first region, and
    wherein in the magnetoresistance effect element, the third magnetic layer, the first magnetic layer, the nonmagnetic layer, and the second magnetic layer are stacked in this order.

2. The device according to claim 1, wherein the first magnetic layer is a storage layer, the nonmagnetic layer is a tunnel barrier layer, the second magnetic layer is a reference layer, and the third magnetic layer is a shift cancelling layer.

3. The device according to claim 1, wherein each of the second regions penetrates through the third magnetic layer.

4. The device according to claim 1, wherein the first region comprises an insulating region.

5. The device according to claim 1, wherein an area of the third magnetic layer is larger than an area of the first magnetic layer.

6. The device according to claim 1, wherein each of the second regions is structured by a plurality of magnetic particles that are gathered together.

7. A method of manufacturing a magnetic memory device, comprising forming a magnetoresistance effect element having a structure in which a first magnetic layer, a nonmagnetic layer, a second magnetic layer, and a third magnetic layer are stacked,
    wherein forming the magnetoresistance effect element includes forming the third magnetic layer such that the third magnetic layer comprises a first region and a plurality of second regions, and each of the second regions is surrounded by the first region, has conductivity, and has a greater magnetic property than the first region, and
    wherein in the magnetoresistance effect element, the third magnetic layer, the first magnetic layer, the nonmagnetic layer, and the second magnetic layer are stacked in this order.

8. The method according to claim 7, wherein the first magnetic layer is a storage layer, the nonmagnetic layer is a tunnel barrier layer, the second magnetic layer is a reference layer, and the third magnetic layer is a shift cancelling layer.

9. The method according to claim 7, wherein forming the third magnetic layer comprises forming a preliminary layer containing a plurality of magnetic particles, and annealing the preliminary layer to form the first region and the plurality of second regions.

10. The method according to claim 9, wherein forming the plurality of second regions comprises gathering the magnetic particles by the annealing.

11. The method according to claim 7, wherein forming the third magnetic layer comprises forming patterns of the second regions, and filling an area surrounding the patterns of the second regions with an insulating material to form the first region.

12. The method according to claim 7, wherein each of the second regions penetrates through the third magnetic layer.

13. The method according to claim 7, wherein the first region comprises an insulating region.

* * * * *